(12) United States Patent
Tabata

(10) Patent No.: US 10,176,839 B2
(45) Date of Patent: Jan. 8, 2019

(54) OPTICAL RECORDING MEDIUM

(71) Applicant: SONY CORPORATION, Tokyo (JP)

(72) Inventor: Hiroshi Tabata, Miyagi (JP)

(73) Assignee: SONY CORPORATION, Tokyo (JP)

(*) Notice: Subject to any disclaimer, the term of this patent is extended or adjusted under 35 U.S.C. 154(b) by 0 days.

(21) Appl. No.: 15/548,155

(22) PCT Filed: Nov. 18, 2015

(86) PCT No.: PCT/JP2015/005776
§ 371 (c)(1),
(2) Date: Aug. 2, 2017

(87) PCT Pub. No.: WO2016/129020
PCT Pub. Date: Aug. 18, 2016

(65) Prior Publication Data
US 2018/0047423 A1 Feb. 15, 2018

(30) Foreign Application Priority Data
Feb. 10, 2015 (JP) .................................. 2015-023904

(51) Int. Cl.
*G11B 7/24* (2013.01)
*G11B 7/24038* (2013.01)
(Continued)

(52) U.S. Cl.
CPC ...... *G11B 7/24038* (2013.01); *C23C 14/0623* (2013.01); *C23C 14/3464* (2013.01); *G11B 7/005* (2013.01); *G11B 7/00454* (2013.01); *G11B 7/00557* (2013.01); *G11B 7/1387* (2013.01); *G11B 7/243* (2013.01);
(Continued)

(58) Field of Classification Search
CPC ............ C23C 14/0623; C23C 14/3464; G11B 7/1387; G11B 7/2433
See application file for complete search history.

(56) References Cited

U.S. PATENT DOCUMENTS

2009/0302293 A1* 12/2009 Morikawa ............... H01L 45/06
257/2
2010/0279053 A1* 11/2010 Tsuchino ............ C23C 14/0623
428/64.5

FOREIGN PATENT DOCUMENTS

| JP | 2004-025801 A | 1/2004 |
| JP | 2005-035058 A | 2/2005 |

(Continued)

OTHER PUBLICATIONS

International Search Report and Written Opinion of PCT Application No. PCT/JP2015/005776, dated Feb. 2, 2016, 02 pages of English Translation and 07 pages of ISRWO.

*Primary Examiner* — Betelhem Shewareged
(74) *Attorney, Agent, or Firm* — Chip Law Group

(57) ABSTRACT

An optical recording medium includes a reflective layer, a first dielectric layer, a phase-change recording layer, and a second dielectric layer. The phase-change recording layer has an average composition represented by SbxInyMz, in which M is at least one of Mo, Ge, Mn, and Al, and x, y, and z are values in the ranges $0.70 \le x \le 0.92$, $0.05 \le y \le 0.20$, and $0.03 \le z \le 0.10$, respectively, provided that $x+y+z=1$, the first dielectric layer includes a zirconium oxide-containing composite material or tantalum oxide, and the second dielectric layer includes a chromium oxide-containing composite material or silicon nitride.

8 Claims, 3 Drawing Sheets

(51) Int. Cl.

| | | |
|---|---|---|
| *C23C 14/34* | (2006.01) | |
| *G11B 7/2433* | (2013.01) | |
| *G11B 7/1387* | (2012.01) | |
| *C23C 14/06* | (2006.01) | |
| *G11B 7/243* | (2013.01) | |
| *G11B 7/0045* | (2006.01) | |
| *G11B 7/005* | (2006.01) | |
| *G11B 7/0055* | (2006.01) | |
| *G11B 7/254* | (2013.01) | |
| *G11B 7/257* | (2013.01) | |
| *G11B 7/258* | (2013.01) | |

(52) U.S. Cl.
CPC ............ *G11B 7/2433* (2013.01); *G11B 7/254* (2013.01); *G11B 7/257* (2013.01); *G11B 7/258* (2013.01); *G06F 2211/007* (2013.01); *G11B 2007/2431* (2013.01); *G11B 2007/24304* (2013.01); *G11B 2007/24312* (2013.01); *G11B 2007/24314* (2013.01); *G11B 2007/2571* (2013.01); *G11B 2007/25706* (2013.01); *G11B 2007/25713* (2013.01)

(56) References Cited

FOREIGN PATENT DOCUMENTS

| | | | |
|---|---|---|---|
| JP | 2006-044215 A | 2/2006 | |
| JP | 2006-247855 A | 9/2006 | |
| JP | 2007-080463 A | 3/2007 | |
| JP | 2007080463 A * | 3/2007 | ........... G11B 7/0045 |
| JP | 5100846 B2 | 12/2012 | |
| JP | 2014-199703 A | 10/2014 | |
| WO | 2008/018225 A1 | 2/2008 | |
| WO | 2010/052842 A1 | 5/2010 | |

* cited by examiner

OPTICAL RECORDING MEDIUM

CROSS REFERENCE TO RELATED APPLICATIONS

This application is a U.S. National Phase of International Patent Application No. PCT/JP2015/005776 filed on Nov. 18, 2015, which claims priority benefit of Japanese Patent Application No. JP 2015-023904 filed in the Japan Patent Office on Feb. 10, 2015. Each of the above-referenced applications is hereby incorporated herein by reference in its entirety.

TECHNICAL FIELD

The present technology relates to an optical recording medium having a phase-change recording layer.

BACKGROUND ART

Now, techniques for stacking a plurality of recording layers are widely used to further increase the storage capacity of optical recording media. Such multilayer techniques have been studied for each of different optical recording media including read-only, recordable, and rewritable optical recording media. A proposed rewritable multilayer optical recording medium with a two-recording-layer structure includes a substrate and a first recording layer (L0 layer), a space layer, a second recording layer (L1 layer), and an optically transparent layer stacked in this order on the substrate. In this optical recording medium with the two-layer structure, a recording layer transparent to the laser beam used for recording on and reproduction from the first recording layer (hereinafter, for the sake of convenience, such a layer is referred to as a "semi-transparent recording layer") is used as the second recording layer. The second recording layer is formed by stacking, for example, a dielectric material, a metal material, and a phase-change recording material to provide the ability to record and reproduce information. Typically, the second recording layer has a structure in which a first dielectric layer, a reflective metal layer, a second dielectric layer, a phase-change recording layer, and a third dielectric layer are stacked in this order on a space layer (see, for example, Patent Document 1).

A product having a three-recording-layer structure for larger storage capacity is also commercialized, in which a first recording layer (L0 layer), a space layer, a second recording layer (L1 layer), a space layer, a third recording layer (L2 layer), and an optically transparent layer are stacked in this order on a substrate. There are also proposed methods for increasing the recording density, which include reducing the shortest mark length to increase the density in the line direction and recording information on both lands and grooves.

In the recording medium with such a two- or three-layer structure, the shallower layer needs to have higher transmittance so that information can be recorded on and reproduced from the layer most distant from the laser beam side. In that case, the recording layers with high absorption coefficient and the reflective layer need to be relatively thin. Particularly in a case where the recording layers are made thin, the crystallization speed can decrease so that the recording speed for rewriting can decrease and the speed of recording on the phase-change recording medium can become significantly lower than that on recordable media.

On the other hand, a technique for improving the speed of recording on a phase-change recording medium includes optimizing the material for the phase-change recording layer to increase the crystallization speed. For example, GeSbSn and InSb (see, for example, Patent Documents 2 and 3), and GaSbGe (see, for example, Patent Document 4) are proposed as the phase-change recording material for such a purpose.

CITATION LIST

Patent Documents

Patent Document 1: International Publication WO2008/018225
Patent Document 2: Japanese Patent Application Laid-Open No. 2005-35058
Patent Document 3: Japanese Patent Application Laid-Open No. 2006-44215
Patent Document 4: Japanese Patent Application Laid-Open No. 2004-25801

SUMMARY OF THE INVENTION

Problems to be Solved by the Invention

Unfortunately, the techniques described in Patent Documents 2 and 3 may provide insufficient recording characteristics or insufficient storage reliability when high-density recording is performed. In addition, Patent Document 4 is silent on storage reliability.

It is an object of the present technology to provide an optical recording medium that makes it possible to obtain good recording characteristics, maintain a good level of overwrite characteristics, and obtain high long-term storage stability, when high-density and high-linear-velocity recording is performed.

Solutions to Problems

To solve the above problems, a first aspect of the present technology is directed to an optical recording medium including a reflective layer, a first dielectric layer, a phase-change recording layer, and a second dielectric layer, in which the phase-change recording layer has an average composition represented by formula (1) below, the first dielectric layer includes a zirconium oxide-containing composite material or tantalum oxide, and the second dielectric layer includes a chromium oxide-containing composite material or silicon nitride.

$$Sb_xIn_yM_z \tag{1}$$

In the formula, M is at least one of Mo, Ge, Mn, and Al, and x, y, and z are values in the ranges $0.70 \leq x \leq 0.92$, $0.05 \leq y \leq 0.20$, and $0.03 \leq z \leq 0.10$, respectively, provided that $x+y+z=1$.

A second aspect of the present technology is directed to an optical recording medium including two or more recording layers each including a reflective layer, a first dielectric layer, a phase-change recording layer, and a second dielectric layer, in which the phase-change recording layer has an average composition represented by formula (1) below, the sum of x and y in the recording layer located shallower than the recording layer most distant from the light-receiving side is larger than the sum of x and y in the most distant recording layer, the first dielectric layer includes a zirconium oxide-containing composite material or tantalum oxide, and the second dielectric layer includes a chromium oxide-containing composite material or silicon nitride.

$$Sb_xIn_yM_z \tag{1}$$

In the formula, M is at least one of Mo, Ge, Mn, and Al, and x, y, and z are values in the ranges $0.70 \leq x \leq 0.92$, $0.05 \leq y \leq 0.20$, and $0.03 \leq z \leq 0.10$, respectively, provided that $x+y+z=1$.

Effects of the Invention

As described above, the present technology makes it possible to obtain good recording characteristics, maintain a good level of overwrite characteristics, and obtain high long-term storage stability, when high-density and high-linear-velocity recording is performed.

MODE FOR CARRYING OUT THE INVENTION

Embodiments of the present technology will be described in the following order.
1 Configuration of optical recording medium
2 Method for producing optical recording medium
3 Advantageous effects
4 Modifications
[1 Configuration of Optical Recording Medium]

Figure 1A:
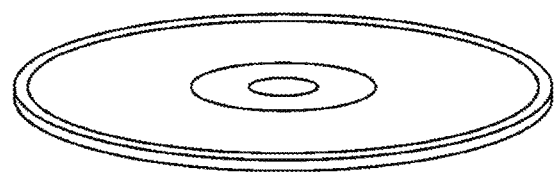
FIG. 1A is a perspective view illustrating an example of the appearance of an optical recording medium according to an embodiment of the present technology.

As illustrated in FIG. 1A, an optical recording medium 10 according to an embodiment of the present technology has a disk shape with an opening (hereinafter referred to as a "center hole") formed at its center. Note that the shape of the optical recording medium 10 is not limited to this example and may be any other shape such as a card shape.

Figure 1B:
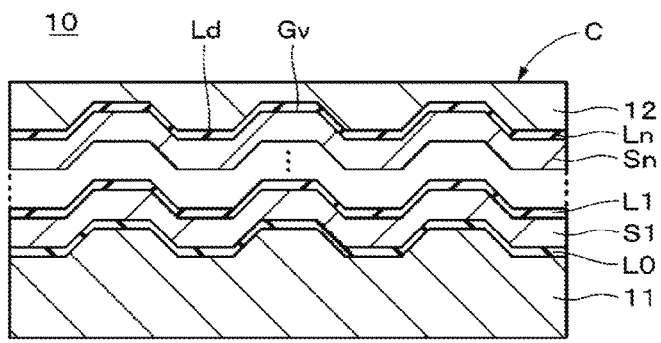
FIG. 1B is a cross-sectional view illustrating an example of the configuration of an optical recording medium according to an embodiment of the present technology.

As illustrated in FIG. 1B, the optical recording medium 10 according to an embodiment of the present technology includes a substrate 11 and a recording layer L0, a space layer S1, a recording layer L1, a space layer S2, a recording layer L2, . . . , a space layer Sn, a recording layer Ln, and an optically transparent layer 12 as a cover layer, which are stacked in this order on a principal surface of the substrate 11. In this regard, n is an integer of 1, 2, or more. Note that, in the description below, the recording layers L0 to Ln are also referred to as the recording layers L in cases where they are not distinguished from one another.

The optical recording medium 10 is a phase-change optical recording medium, in which information is recorded on the recording layers L0 to Ln by changing their state into an amorphous state by laser beam irradiation and information is erased from the recording layers L0 to Ln by changing their state into a crystalline state. Specifically, information signals are recorded on or reproduced from the optical recording medium 10 using a laser beam, which is incident on the surface C on the optically transparent layer 12 side and applied to each of the recording layers L0 to Ln. For example, a laser beam with a wavelength in the range of 400 nm to 410 nm is collected by an objective lens with a numerical aperture in the range of 0.84 to 0.86 and then applied to each of the recording layers L0 to Ln from the optically transparent layer 12 side when information signals are recorded or reproduced. The optical recording medium 10 with such features may be, for example, multilayer Blu-ray Disc Rewritable (BD-RE). The laser beam for recording or reproducing information signals on or from the recording layers L0 to Ln is applied to the surface C. Hereinafter, the surface C will be referred to as the light-receiving surface C.

Recording on the optical recording medium 10 is performed using, for example, a method of recording information signals on grooves Gv (groove recording method) or a method of recording information signals on both lands Ld and grooves Gv (land-groove recording method). The latter is preferred in order to increase the recording density. The optical recording medium 10 is an optical recording medium capable of high-density and high-linear-velocity recording, which preferably has a highest recording linear velocity of 14 m/s to 23 m/s and a shortest recording mark length of 112 nm or less.

Hereinafter, the components of the optical recording medium 10, specifically, the substrate 11, the recording layers L0 to Ln, the space layers S1 to Sn, and the optically transparent layer 12, will be described, respectively.

(Substrate)

The substrate 11 has, for example, a disk shape with a center hole formed at its center. One principal surface of the substrate 11 is a concave-convex surface that forms lands Ld and grooves Gv. The recording layer L0 is formed on the concave-convex surface. In the description, a concave part of the concave-convex surface is referred to as a land Ld, and a convex part of the concave-convex surface is referred to as a groove Gv.

The land Ld and the groove Gv may have any of various shapes, such as a spiral shape and a concentric circular shape. The land Ld and the groove Gv may also be wobbled for stabilization of linear velocity, addition of address information, and other purposes.

The size (diameter) of the substrate 11 is selected, for example, to be 120 mm. The thickness of the substrate 11 is selected in view of rigidity, preferably to be 0.3 mm to 1.3 mm, more preferably 0.6 mm to 1.3 mm, typically 1.1 mm. In addition, the size (diameter) of the center hole is selected, for example, to be 15 mm.

The substrate 11 is made of, for example, a plastic material or glass, preferably a plastic material in view of costs. Examples of such a plastic material include polycarbonate resin, polyolefin resin, and acrylic resin.

(Recording Layer)

Figure 2A:
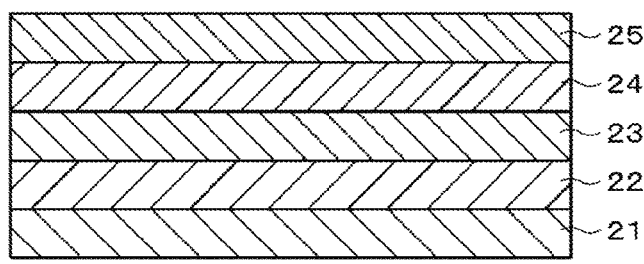
FIG. 2A is a cross-sectional view illustrating an example of the configuration of a recording layer most distant from the light-receiving surface.

As illustrated in FIG. 2A, the recording layer L0 most distant from the light-receiving surface C is a multilayer film including, for example, a reflective layer 21, a first dielectric layer 22, a phase-change recording layer 23, a second dielectric layer 24, and a protective layer 25, which are staked in this order on the substrate 11. Hereinafter, the configuration of the recording layer L0 will be described with reference to an example where the recording layer L0 has a protective layer 25. However, the protective layer 25 may also be omitted.

The material used to form the reflective layer 21 includes, for example, an elementary substance such as Al, Ag, Au, Ni, Cr, Ti, Pd, Co, Si, Ta, W, Mo, or Ge, or any alloy thereof, as a main component. Among such materials, an Al-, Ag-, Au-, Si-, or Ge-based material is particularly preferred for practicability. Examples of alloys that are preferably used include Al—Ti, Al—Cr, Al—Cu, Al—Mg—Si, Ag—Nd—Cu, Ag—Pd—Cu, Ag—Pd—Ti, and Si—B. Selection from these materials should preferably be made in view of optical and thermal characteristics. For example, an Al- or Ag-based material is preferably used because of its high reflectivity even in the short wavelength region.

The first and second dielectric layers 22 and 24 serve to protect the phase-change recording layer 23 and control optical characteristics and thermal stability. The first dielectric layer 22 includes a zirconium oxide-containing composite material or tantalum oxide. The zirconium oxide-containing composite material is preferably a composite oxide including zirconium oxide and at least one of indium oxide and silicon oxide. The second dielectric layer 24 includes a chromium oxide-containing composite material or silicon nitride. The chromium oxide-containing composite material is preferably a composite oxide including two or more of chromium oxide, zirconium oxide, and silicon oxide.

In a case where the first dielectric layer 22 includes zirconium oxide and indium oxide, the first dielectric layer 22 preferably has a zirconium oxide content of 20 mol % to 50 mol % and an indium oxide content of 10 mol % to 50 mol %. This is because when high-density and high-linear-velocity recording is performed in such a case, a particularly good level of overwrite characteristics can be maintained and particularly high long-term storage stability can be achieved.

In a case where the second dielectric layer 24 includes chromium oxide and zirconium oxide, the second dielectric layer 24 preferably has a chromium oxide content of 20 mol % to 50 mol % and a zirconium oxide content of 30 mol % to 70 mol %. This is because when high-density and high-linear-velocity recording is performed in such a case, a particularly good level of overwrite characteristics can be maintained and particularly high long-term storage stability can be achieved.

The phase-change recording layer 23 is a recording layer on which information signals can be repeatedly recorded by laser beam irradiation. Specifically, the phase-change recording layer 23 is a recording layer on which information signals can be recorded and rewritten by reversible change between amorphous and crystalline phases upon laser beam irradiation. The phase-change recording layer 23 includes SbInM, in which M is at least one of Mo, Ge, Mn, and Al. The phase-change recording layer 23 including SbInM preferably has an average composition represented by formula (1) below.

$$Sb_xIn_yM_z \tag{1}$$

In the formula, x, y, and z are values in the ranges $0.70 \leq x \leq 0.92$, $0.05 \leq y \leq 0.20$, and $0.03 \leq z \leq 0.10$, respectively, provided that x, y, and z are atomic ratios satisfying $x+y+z=1$.

If necessary, the phase-change recording layer 23 may contain one or more materials selected from N, S, Mg, Ca, Ti, V, Ni, Cu, Zn, Ga, Se, Zr, Nb, Rh, Pd, Ag, Sn, Hf, Ta, W, Re, Au, Bi, lanthanoid elements, and actinoid elements.

The phase-change recording layer 23 preferably has a thickness of 8 nm or less. The phase-change recording layer 23 with a thickness of 8 nm or less can provide the advantage mentioned below in a case where the number of the recording layers L is 3. Specifically, when the phase-change recording layer 23 has a thickness of 8 nm or less, higher transmittance can be achieved, so that the amount of light returning from the layer more distant from the light incident side can be kept at a level enough to obtain good reproduction characteristics with current consumer drives.

The material used to form the protective layer 25 may be a transparent dielectric material including, for example, at least one selected from the group consisting of an oxide, a nitride, a sulfide, a carbide, and a fluoride. The oxide may be, for example, an oxide of at least one element selected from the group consisting of In, Zn, Sn, Al, Si, Ge, Ti, Ga, Ta, Nb, Hf, Zr, Cr, Bi, and Mg. The nitride may be, for example, a nitride of at least one element selected from the group consisting of In, Sn, Ge, Cr, Si, Al, Nb, Mo, Ti, W, Ta, and Zn, preferably a nitride of at least one element selected from the group consisting of Si, Ge, and Ti. The sulfide may be, for example, Zn sulfide. The carbide may be, for example, a carbide of at least one element selected from the group consisting of In, Sn, Ge, Cr, Si, Al, Ti, Zr, Ta, and W, preferably a carbide of at least one element selected from the group consisting of Si, Ti, and W. The fluoride may be, for example, a fluoride of at least one element selected from the group consisting of Si, Al, Mg, Ca, and La.

Figure 2B:
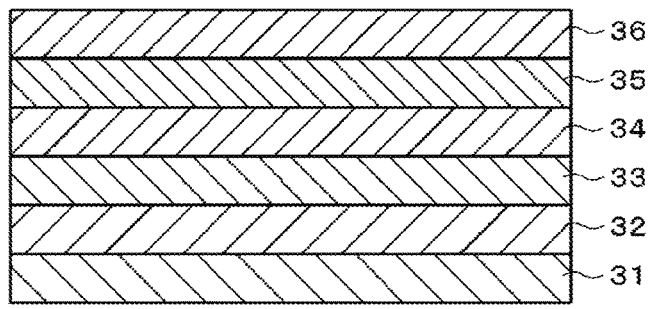
FIG. 2B is a cross-sectional view illustrating an example of the configuration of a recording layer other than that most distant from the light-receiving surface.

The recording layers L1 to Ln closer to the light-receiving surface C than the recording layer L0 are what are called transmission recording layers. As illustrated in FIG. 2B, the recording layers L1 to Ln are each a multilayer film including a transmittance enhancing layer 31, a semi-transparent reflective layer 32, a first dielectric layer 33, a phase-change recording layer 34, a second dielectric layer 35, and a protective layer 36, which are stacked in this order on one of the space layers S1 to Sn. Hereinafter, the configuration of the recording layers L1 to Ln will be described with reference to an example where the recording layers L1 to Ln each have a transmittance enhancing layer 31 and a protective layer 36. However, at least one of these layers may also be omitted. Alternatively, although the configuration of the recording layers L1 to Ln will be described with reference to an example where these layers have the same multilayer film, the recording layers L1 to Ln may have different layered configuration depending on the characteristics (such as optical characteristics and durability) required of each of the recording layers L1 to Ln.

The transmittance enhancing layer 31 serves to enhance the transmittance of the recording layers L1 to Ln. The material used to form the transmittance enhancing layer 31 is preferably a transparent dielectric material with a high refractive index, such as $TiO_2$, so that the refractive index difference can be made small at the interface with the semi-transparent reflective layer 32.

The semi-transparent reflective layer 32 is designed to be transparent to the laser beam for recording or reproducing information signals. Specifically, the semi-transparent reflective layer 32 has such a degree of transmittance that information signals can be recorded on or reproduced from the recording layer L more distant from the light-receiving surface C than the recording layer L having this semi-transparent reflective layer 32 when the laser beam is applied. Examples of materials that may be used to form the semi-transparent reflective layer 32 include those listed for the reflective layer 21.

The sum of x and y in each of the recording layers L1 to Ln, which are closer to the light-receiving surface C than the recording layer L0, is preferably larger than the sum of x and y in the recording layer L0 most distant from the light-receiving surface C. This is because in such a case, the recording layers L1 to Ln on the closer side can have a similar level of recording characteristics to the recording layer L0 on the most distant side. In this regard, the sum of x and y in formula (1) may be set larger in the recording layer L closer to the light-receiving surface C. It will be described below why a similar level of recording characteristics to the recording layer L0 can be obtained in such cases.

In order to increase the reflectivity of the recording layer L0 most distant from the light-receiving surface C, the recording layers L1 to Ln located shallower than the recording layer L0 should preferably have a sufficient transmittance to the laser beam for recording or reproducing information signals. In order to increase the transmittance of the recording layers L1 to Ln, the phase-change recording layer 34 as a component of each of the recording layers L1 to Ln may be made thin. However, as the thickness of the phase-change recording layer 34 decreases, the volume of the recording material capable of undergoing the phase change decreases, so that the structural change becomes less likely to occur, which will lead to a decrease in crystallization speed. Such a decrease in crystallization speed due to the decrease in the thickness of the phase-change recording layer 34 may be compensated for by selecting the composition of the phase-change recording material to increase the crystallization speed. Specifically, the total amount of the elements Sb and In (namely, the sum of x and y in formula (1)) in the phase-change recording layer 34 may be increased in the recording layers L1 to Ln located shallower than the recording layer L0.

The first dielectric layer 33, the phase-change recording layer 34, the second dielectric layer 35, and the protective layer 36 are similar to the first dielectric layer 22, the phase-change recording layer 23, the second dielectric layer 24, and the protective layer 25, respectively. However, the thickness, the component ratio, and other properties of the first dielectric layer 33, the phase-change recording layer 34, the second dielectric layer 35, and the protective layer 36 may be selected to differ from those of the first dielectric layer 22, the phase-change recording layer 23, the second dielectric layer 24, and the protective layer 25, respectively, depending on the desired characteristics.

(Space Layer)

The space layers S1 to Sn serve to separate the recording layers L0 to Ln from one another with a distance long enough physically and optically, and the space layers S1 to Sn each have a concave-convex surface. The concave-convex surface forms lands Ld and grooves Gv. The land Ld and the groove Gv may have any of various shapes, such as a spiral shape and a concentric circular shape. The land Ld and the groove Gv may also be wobbled for stabilization of linear velocity, addition of address information, and other purposes.

The thickness of the space layers S1 to Sn is preferably set to 9 μm to 50 μm. The space layers S1 to Sn are preferably, but not necessarily, made from an ultraviolet-curable acrylic resin. In addition, the space layers S1 to Sn preferably have sufficiently high optical transparency because they form an optical path for the laser beam for recording or reproducing information signals on or from deeper layers.

(Optically Transparent Layer)

The optically transparent layer 12 is, for example, a resin layer formed by curing a photosensitive resin such as an ultraviolet-curable resin. The resin layer may be made from, for example, an ultraviolet-curable acrylic resin. Alternatively, the optically transparent layer 12 may include a ring-shaped optically transparent sheet and an adhesive layer for bonding the optically transparent sheet to the substrate 11. The optically transparent sheet is preferably made of a material with low ability to absorb the laser beam for recording and reproduction. Specifically, the optically transparent sheet is preferably made of a material with a transmittance of 90% or more to the laser beam. The optically transparent sheet may be made of, for example, a polycarbonate resin material or a polyolefin resin (such as ZEONEX®). The adhesive layer may be made using, for example, an ultraviolet-curable resin or a pressure sensitive adhesive (PSA).

The thickness of the optically transparent layer 12 is preferably selected in the range of 10 μm to 177 μm and typically selected in such a way that the optically transparent layer 12 and the space layers S1 to Sn have a total thickness of 100 μm. High-density recording can be achieved using a combination of such a thin optically transparent layer 12 and an objective lens configured to have a high numerical aperture (NA) of, for example, about 0.85.

[2 Method for Producing Optical Recording Medium]

Next, an example of a method for producing the optical recording medium according to an embodiment of the present technology will be described.

(Step of Forming Substrate)

First, a substrate 11 having a concave-convex surface as a principal surface is formed. The method of forming the substrate 11 may be, for example, injection molding or photo-polymer method (photo-polymerization (2P) technique).

(Step of Forming Recording Layer)

Subsequently, a reflective layer 21, a first dielectric layer 22, a phase-change recording layer 23, a second dielectric layer 24, and a protective layer 25 are deposited in this order on the concave-convex surface of the substrate 11, for example, by a sputtering process. As a result, a recording layer L0 is formed on the substrate 11.

(Step of Forming Space Layer)

Subsequently, an ultraviolet-curable resin is uniformly applied to the recording layer L0, for example, by spin coating. A stamper with a concave-convex pattern is then pressed against the ultraviolet-curable resin, which has been uniformly applied to the recording layer L0. After the ultraviolet-curable resin is cured by being irradiated with ultraviolet rays, the stamper is peeled off. As a result, the concave-convex pattern of the stamper is transferred to the ultraviolet-cured resin, and a space layer S1 having a concave-convex surface is formed on the recording layer L0.

(Step of Forming Recording Layer)

Subsequently, a transmittance enhancing layer 31, a semi-transparent reflective layer 32, a first dielectric layer 33, a phase-change recording layer 34, a second dielectric layer 35, and a protective layer 36 are deposited in this order on the concave-convex surface of the space layer S1, for example, by a sputtering process. As a result, a recording layer L1 is formed on the space layer S1.

(Steps of Forming Space Layer and Recording Layer)

Subsequently, a space layer S2, a recording layer L2, . . . , a space layer Sn, and a recording layer Ln are deposited in this order on the recording layer L1 by steps similar to the steps of forming the space layer S1 and the recording layer L1.

(Step of Forming Optically Transparent Layer)

Subsequently, for example, an ultraviolet-curable resin is applied to the recording layer Ln by spin coating and then cured by being irradiated with ultraviolet rays. As a result, an optically transparent layer 12 is formed on the recording layer Ln.

The desired optical recording medium 10 is obtained by the steps described above.

[3 Advantageous Effects]

In the optical recording medium 10 according to the embodiment described above, the phase-change recording layers 23 and 34 each have the average composition represented by formula (1) above. In addition, the first dielectric layers 22 and 33 each include a zirconium oxide-containing composite material or tantalum oxide, and the second dielectric layers 24 and 35 each include a chromium oxide-containing composite material or silicon nitride. These features make it possible to obtain good recording characteristics, maintain a good level of overwrite characteristics, and obtain high long-term storage stability, when high-density and high-linear-velocity recording is performed.

[4 Modifications]

Figure 3:
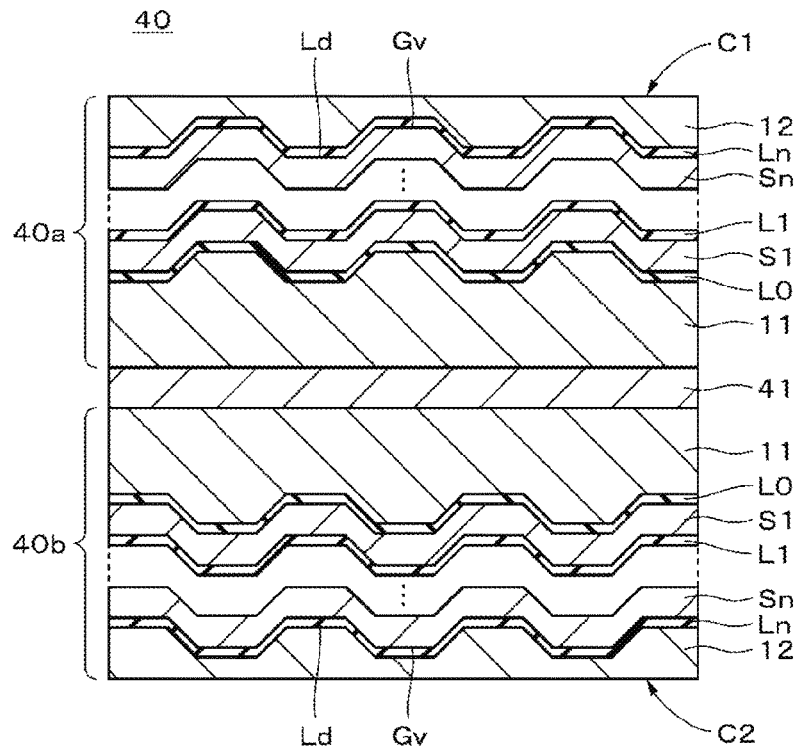
FIG. 3 is a cross-sectional view illustrating the configuration of an optical recording medium according to a modified embodiment of the present technology.
Figure 4:
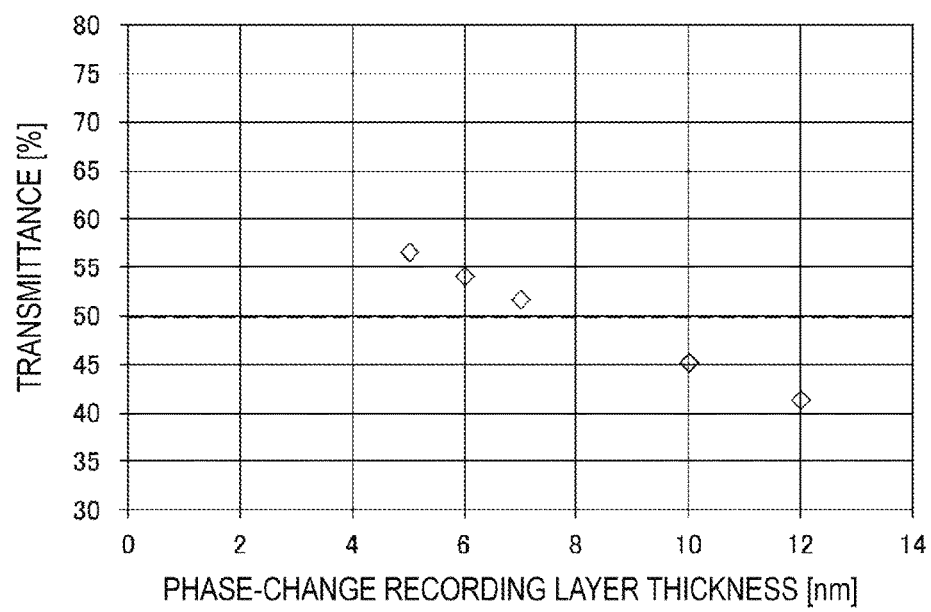
FIG. 4 is a graph showing the relationship between the transmittance of the optical disks of Examples 1 and 27 to 30 and the thickness of their phase-change recording layer.

As illustrated in FIG. 3, an optical recording medium 40 according to a modified embodiment of the present technology is what is called a laminate-type optical recording medium, which includes a first disk 40a, a second disk 40b, and a bonding layer 41 provided between the first and second disks 40a and 40b. In this modified embodiment, elements corresponding to those in the first embodiment are denoted by the same reference signs.

The first and second disks 40a and 40b have the same configuration, which includes a substrate 11 and a recording layer L0, a space layer S1, a recording layer L1, . . . , a space layer Sn, a recording layer Ln, and an optically transparent layer 12 as a cover layer, which are stacked in this order on a principal surface of the substrate 11. In this regard, n is an integer of 1, 2, or more.

The optical recording medium 40 has, on both sides, light-receiving surfaces to which a beam for recording or reproducing information signals are to be applied. More specifically, the optical recording medium 40 has a first light-receiving surface C1, to which a laser beam for recording or reproducing information signals on or from the first disk 40a is to be applied, and a second light-receiving surface C2, to which a laser beam for recording or reproducing information signals on or from the second disk 40b is to be applied.

The substrate 11 has a thickness of, for example, 0.5 mm. The first and second disks 40a and 40b each have a thickness of, for example, 0.6 mm. The optical recording medium 40 has a thickness of, for example, 1.2 mm. For higher recording density, the method for recording on the optical recording medium 40 is preferably a land-groove recording method.

The bonding layer 41 includes a product obtained by curing an ultraviolet-curable resin. The first and second disks 10 and 20 are bonded together with the bonding layer 41. More specifically, the first and second disks 40a and 40b are bonded together in such a way that their surfaces opposite to their optically transparent layer 12-side surfaces face each other. The bonding layer 41 has a thickness of, for example, 0.01 mm to 0.22 mm. The ultraviolet-curable resin is, for example, a radically-polymerizable, ultraviolet-curable resin.

EXAMPLES

Hereinafter, the present technology will be more specifically described with reference to examples. It will be understood that the examples are not intended to limit the present technology in any way. Note that, in the examples, in a case where the optical disk has three recording layers, they are called L0, L1, and L2 layers in order from the substrate side to the laser light-receiving surface side.

The examples will be described in the following order.
i Relationship between recording characteristics and combination of materials for first and second dielectric layers and phase-change recording layer and relationship between recording speed and recording characteristics
ii Relationship between recording characteristics and material and component ratios of phase-change recording layer
iii Relationship between recording characteristics and component ratios of first dielectric layer
iv Relationship between recording characteristics and component ratios of second dielectric layer
v Relationship between recording characteristics and thickness of phase-change recording layer
vi Relationship between recording characteristics of respective layers (three-layer disk)

<i Relationship Between Recording Characteristics and Combination of Materials for First and Second Dielectric Layers and Phase-Change Recording Layer and Relationship Between Recording Speed and Recording Characteristics>

Example 1

First, a 1.1-mm-thick polycarbonate substrate was formed by injection molding. Note that a concave-convex surface with grooves and lands was formed on the polycarbonate substrate. Subsequently, a sputtering process was performed to deposit a transmittance enhancing layer, a semi-transparent reflective layer, a first dielectric layer, a phase-change recording layer, a second dielectric layer, and a protective layer, each having the configuration (material and thickness) shown below, on the concave-convex surface of the polycarbonate substrate. As a result, a recording layer was formed on the concave-convex surface of the polycarbonate substrate.

Transmittance enhancing layer: $TiO_2$, 11 nm
Semi-transparent reflective layer: Ag alloy (AgPdCu), 9.5 nm
First dielectric layer: $(SiO_2)_{35}$—$(In_2O_3)_{30}$—$(ZrO_2)_{35}$, 6 nm
Phase-change recording layer: $Sb_{85}$—$In_{10}$—$Mo_5$, 7 nm
Second dielectric layer: $(SiO_2)_{20}$—$(Cr_2O_3)_{30}$—$(ZrO_2)_{50}$, 22 nm
Protective layer: SiN, 30 nm Subsequently, an ultraviolet-curable resin was uniformly applied to the recording layer by spin coating, and then cured by being irradiated with ultraviolet rays to form a 100-μm-thick optically transparent layer. As a result, the desired optical disk was obtained.

Examples 2 to 6 and Comparative Examples 1 to 6

Optical disks were obtained similarly to Example 1, except that the materials for the first dielectric layer, the phase-change recording layer, and the second dielectric layer were changed as shown in Table 1.

(Evaluation)

The optical disks obtained as described above were evaluated as described below.

(Direct Overwrite (DOW) 10 (6×) Characteristics)

Using a disk tester (ODU-1000 (trade name) manufactured by PULSTEC INDUSTRIAL CO., LTD.), 1-7 modulated data was repeatedly recorded 11 times at a density of 33.3 GB per layer on each disk under the following conditions: numerical aperture NA=0.85, recording wavelength λ=405 nm, recording linear velocity v=22.13 m/s (6× speed equivalent), and then i-MLSE was measured at a reproduction linear velocity v of 7.38 m/s (double speed equivalent). In this regard, the 2T mark length as the shortest mark length was 112 nm.

(DOW 1,000 (6×) Characteristics)

Using a disk tester (ODU-1000 (trade name) manufactured by PULSTEC INDUSTRIAL CO., LTD.), 1-7 modulated data was repeatedly recorded 1,000 times at a density of 33.3 GB per layer on each disk under the following conditions: numerical aperture NA=0.85, recording wavelength λ=405 nm, recording linear velocity v=22.13 m/s (6× speed equivalent), and then i-MLSE was measured at a reproduction linear velocity v of 7.38 m/s (double speed equivalent).

(Archival (6×) Characteristics)

Using a disk tester (ODU-1000 (trade name) manufactured by PULSTEC INDUSTRIAL CO., LTD.), 1-7 modulated data was repeatedly recorded 11 times at a density of 33.3 GB per layer on each disk under the following conditions: numerical aperture NA=0.85, recording wavelength λ=405 nm, recording linear velocity v=22.13 m/s (6× speed equivalent). Subsequently, after each disk was stored in an environment at 80° C. and 85% for 400 hours, i-MLSE was measured at a reproduction linear velocity v of 7.38 m/s (double speed equivalent).

Subsequently, based on the results of the measurement of DOW 10 (6×) characteristics, DOW 1,000 (6×) characteristics, and Archival (6×) characteristics, the optical disks were evaluated according to the following criteria.

⊙: The resulting i-MLSE value is 12.0% or less in all the three measurements.

◯: The resulting i-MLSE value is 13.0% or less in all the three measurements, and more than 12.0% to 13.0% in at least one of the three measurements.

x: The resulting i-MLSE value is more than 13.0% in at least one of the three measurements.

Note that the reference values shown above are selected for the following reason. If i-MLSE is more than 15.0%, it will be impossible to obtain good reproduction characteristics with general consumer drives. In view of variations between reproduction systems of consumer drives, i-MLSE should preferably be 13.0% or less. Additionally, in view of margin for production of optical disks, i-MLSE should preferably be 12.0% or less.

Table 1 shows the relationship between the recording characteristics and the combination of the materials for the first and second dielectric layers and the phase-change recording layer.

TABLE 1

|  | First dielectric layer | Phase-change recording layer | Second dielectric layer |
|---|---|---|---|
| Example 1 | $(ZrO_2)_{35}$—$(In_2O_3)_{30}$—$(SiO_2)_{35}$ | SbInMo | $(ZrO_2)_{50}$—$(Cr_2O_3)_{30}$—$(SiO_2)_{20}$ |
| Example 2 | $Ta_2O_5$ | SbInMo | $(ZrO_2)_{50}$—$(Cr_2O_3)_{30}$—$(SiO_2)_{20}$ |
| Example 3 | $(ZrO_2)_{35}$—$(In_2O_3)_{30}$—$(SiO_2)_{35}$ | SbInMo | SiN |
| Example 4 | $(ZrO_2)_{35}$—$(In_2O_3)_{30}$—$(SiO_2)_{35}$ | SbInGe | $(ZrO_2)_{50}$—$(Cr_2O_3)_{30}$—$(SiO_2)_{20}$ |
| Example 5 | $(ZrO_2)_{35}$—$(In_2O_3)_{30}$—$(SiO_2)_{35}$ | SbInMn | $(ZrO_2)_{50}$—$(Cr_2O_3)_{30}$—$(SiO_2)_{20}$ |
| Example 6 | $(ZrO_2)_{35}$—$(In_2O_3)_{30}$—$(SiO_2)_{35}$ | SbInAl | $(ZrO_2)_{50}$—$(Cr_2O_3)_{30}$—$(SiO_2)_{20}$ |
| Comparative Example 1 | $Ga_2O_3$ | SbInMo | $(ZrO_2)_{50}$—$(Cr_2O_3)_{30}$—$(SiO_2)_{20}$ |
| Comparative Example 2 | SiN | SbInMo | $(ZrO_2)_{50}$—$(Cr_2O_3)_{30}$—$(SiO_2)_{20}$ |
| Comparative Example 3 | $(ZnS)_{80}$—$(SiO_2)_{20}$ | SbInMo | $(ZrO_2)_{50}$—$(Cr_2O_3)_{30}$—$(SiO_2)_{20}$ |
| Comparative Example 4 | $(ZrO_2)_{35}$—$(In_2O_3)_{30}$—$(SiO_2)_{35}$ | SbInMo | $Ga_2O_3$ |
| Comparative Example 5 | $(ZrO_2)_{35}$—$(In_2O_3)_{30}$—$(SiO_2)_{35}$ | SbInMo | $(ZnS)_{80}$—$(SiO_2)_{20}$ |
| Comparative Example 6 | $(In_2O_3)_{50}$—$(SiO_2)_{50}$ | SbInMo | $(ZrO_2)_{50}$—$(Cr_2O_3)_{30}$—$(SiO_2)_{20}$ |

|  | Phase-change recording layer Component ratios [at %] | | | i-MLSE | | | |
|---|---|---|---|---|---|---|---|
|  | x 70-92 | y 5-20 | z 3-10 | DOW10 13% or less | DOW1000 13% or less | Archival 13% or less | Rating |
| Example 1 | 85 | 10 | 5 | 10.1 | 11.3 | 10.9 | ⊙ |
| Example 2 | 85 | 10 | 5 | 10.2 | 11.1 | 11 | ⊙ |
| Example 3 | 85 | 10 | 5 | 10.4 | 12.5 | 10.9 | ◯ |
| Example 4 | 85 | 10 | 5 | 9.8 | 11 | 10.4 | ⊙ |
| Example 5 | 85 | 10 | 5 | 10 | 11.2 | 10.5 | ⊙ |
| Example 6 | 85 | 10 | 5 | 11 | 12.3 | 11.4 | ◯ |
| Comparative Example 1 | 85 | 10 | 5 | 11 | 13.3 | 14.5 | X |
| Comparative Example 2 | 85 | 10 | 5 | 11.3 | 15.5 | 13.5 | X |
| Comparative Example 3 | 85 | 10 | 5 | 12.5 | 15.3 | 16.3 | X |
| Comparative Example 4 | 85 | 10 | 5 | 13.5 | 15.7 | 14.5 | X |
| Comparative Example 5 | 85 | 10 | 5 | 11.6 | 13.9 | 14.2 | X |
| Comparative Example 6 | 85 | 10 | 5 | 12.4 | 14.2 | 16.9 | X |

The results of the evaluation described above show the following.

The use of a phase-change recording layer including SbInM (M is at least one element selected from Mo, Ge, Mn, and Al), a first dielectric layer including a zirconium oxide-containing composite material or tantalum oxide, and a second dielectric layer including a chromium oxide-containing composite material or silicon nitride makes it possible to obtain good recording characteristics, maintain a good level of overwrite characteristics, and obtain high long-term storage stability, when high-density and high-linear-velocity recording is performed.

(Evaluation)

The optical disks obtained as described above were further evaluated as described below.

(DOW 10 (4×) Characteristics)

The i-MLSE value was measured similarly to that for the DOW 10 (6×) characteristics described above, except that the recording linear velocity v was changed to 14.75 m/s (4× speed equivalent).

(DOW 1,000 (4×) Characteristics)

The i-MLSE value was measured similarly to that for the DOW 1,000 (6×) characteristics described above, except that the recording linear velocity v was changed to 14.75 m/s (4× speed equivalent).

(Archival (4×) Characteristics)

The i-MLSE value was measured similarly to that for the Archival (6×) characteristics described above, except that the recording linear velocity v was changed to 14.75 m/s (4× speed equivalent).

Subsequently, based on the results of the measurement of DOW 10 (4×, 6×) characteristics, DOW 1,000 (4×, 6×) characteristics, and the Archival (4×, 6×) characteristics, the optical disks were evaluated according to the following criteria.

⊙: The resulting i-MLSE value is 12.0% or less in all the six measurements.

○: The resulting i-MLSE value is 13.0% or less in all the six measurements, and more than 12.0% to 13.0% in at least one of the six measurements.

×: The resulting i-MLSE value is more than 13.0% in at least one of the six measurements.

Tables 2A and 2B show the relationship between the recording speed and the recording characteristics.

TABLE 2A

|  | First dielectric layer | Phase-change recording layer | Second dielectric layer | Phase-change recording layer Component ratios [at %] | | |
|---|---|---|---|---|---|---|
|  |  |  |  | x 13% or less | y 13% or less | z 13% or less |
| Example 1 | $(ZrO_2)_{35}$—$(In_2O_3)_{30}$—$(SiO_2)_{35}$ | SbInMo | $(ZrO_2)_{50}$—$(Cr_2O_3)_{30}$—$(SiO_2)_{20}$ | 85 | 10 | 5 |
| Example 2 | $Ta_2O_5$ | SbInMo | $(ZrO_2)_{50}$—$(Cr_2O_3)_{30}$—$(SiO_2)_{20}$ | 85 | 10 | 5 |
| Example 3 | $(ZrO_2)_{35}$—$(In_2O_3)_{30}$—$(SiO_2)_{35}$ | SbInMo | SiN | 85 | 10 | 5 |
| Example 4 | $(ZrO_2)_{35}$—$(In_2O_3)_{30}$—$(SiO_2)_{35}$ | SbInGe | $(ZrO_2)_{50}$—$(Cr_2O_3)_{30}$—$(SiO_2)_{20}$ | 85 | 10 | 5 |
| Example 5 | $(ZrO_2)_{35}$—$(In_2O_3)_{30}$—$(SiO_2)_{35}$ | SbInMn | $(ZrO_2)_{50}$—$(Cr_2O_3)_{30}$—$(SiO_2)_{20}$ | 85 | 10 | 5 |
| Example 6 | $(ZrO_2)_{35}$—$(In_2O_3)_{30}$—$(SiO_2)_{35}$ | SbInAl | $(ZrO_2)_{50}$—$(Cr_2O_3)_{30}$—$(SiO_2)_{20}$ | 85 | 10 | 5 |

TABLE 2B

|  | i-MLSE(4×) | | | i-MLSE(6×) | | | |
|---|---|---|---|---|---|---|---|
|  | DOW10 13% or less | DOW1000 13% or less | Archival 13% or less | DOW10 13% or less | DOW1000 13% or less | Archival 13% or less | Rating |
| Example 1 | 9.4 | 10.1 | 10.4 | 10.1 | 11.3 | 10.9 | ⊙ |
| Example 2 | 9.6 | 10.3 | 10.5 | 10.2 | 11.1 | 11 | ⊙ |
| Example 3 | 9.8 | 11.1 | 10.7 | 10.4 | 12.5 | 10.9 | ○ |
| Example 4 | 9.1 | 9.8 | 10.0 | 9.8 | 11 | 10.4 | ⊙ |
| Example 5 | 9.6 | 10.8 | 10.3 | 10 | 11.2 | 10.5 | ⊙ |
| Example 6 | 10.5 | 11.6 | 11.2 | 11 | 12.3 | 11.4 | ○ |

The results of the evaluation described above show the following.

Even when the recording speed is changed from 4× to 6×, the overwrite and archival characteristics are maintained in an appropriate range though a tendency to increase i-MLSE is observed for both the overwrite and archival characteristics.

<ii Relationship Between Recording Characteristics and Material and Component Ratios of Phase-Change Recording Layer>

Examples 7 to 10 and Comparative Examples 7 to 9

Optical disks were obtained similarly to Example 1, except that the component ratios of the phase-change recording layer were changed as shown in Table 3.

Examples 11 and 12 and Comparative Examples 10 to 12

Optical disks were obtained similarly to Example 4, except that the component ratios of the phase-change recording layer were changed as shown in Table 3.

Examples 13 and 14 and Comparative Examples 13 and 14

Optical disks were obtained similarly to Example 5, except that the component ratios of the phase-change recording layer were changed as shown in Table 3.

Examples 15 and 16 and Comparative Examples 15 and 16

Optical disks were obtained similarly to Example 6, except that the component ratios of the phase-change recording layer were changed as shown in Table 3.

Comparative Examples 17 to 21

Optical disks were obtained similarly to Example 1, except that the material for the phase-change recording layer was changed as shown in Table 3.

(Evaluation)

The DOW 10 (6×) characteristics, the DOW 1,000 (6×) characteristics, and the Archival (6×) characteristics of the optical disks obtained as described above were evaluated as in Examples 1 to 6.

Table 3 shows the relationship between the recording characteristics and the material and component ratios of the phase-change recording layer.

TABLE 3

| | First dielectric layer | Phase-change recording layer | Second dielectric layer |
|---|---|---|---|
| Example 1 | $(ZrO_2)_{35}$—$(In_2O_3)_{30}$—$(SiO2)_{35}$ | SbInMo | $(ZrO_2)_{50}$—$(Cr_2O_3)_{30}$—$(SiO_2)_{20}$ |
| Example 7 | | | |
| Example 8 | | | |
| Example 9 | | | |
| Example 10 | | | |
| Example 4 | | SbInGe | |
| Example 11 | | | |
| Example 12 | | | |
| Example 5 | | SbInMn | |
| Example 13 | | | |
| Example 14 | | | |
| Example 6 | | SbInAl | |
| Example 15 | | | |
| Example 16 | | | |
| Comparative Example 7 | | SbInMo | |
| Comparative Example 8 | | | |
| Comparative Example 9 | | | |
| Comparative Example 10 | | SbInGe | |
| Comparative Example 11 | | | |
| Comparative Example 12 | | | |
| Comparative Example 13 | | SbInMn | |
| Comparative Example 14 | | | |
| Comparative Example 15 | | SbInAl | |
| Comparative Example 16 | | | |
| Comparative Example 17 | | SbInCo | |
| Comparative Example 18 | | SbInCr | |
| Comparative Example 19 | | SbInTe | |
| Comparative Example 20 | | $Sb_{70}Te_{21}Ge_5In_4$ | |
| Comparative Example 21 | | $Ge_{44}Te_{51}Di_5$ | |

| | Phase-change recording layer Component ratios [at %] | | | i-MLSE | | | |
|---|---|---|---|---|---|---|---|
| | x 70-92 | y 5-20 | z 3-10 | DOW10 13% or less | DOW1000 13% or less | Archival 13% or less | Rating |
| Example 1 | 85 | 10 | 5 | 10.1 | 11.3 | 10.9 | ⊙ |
| Example 7 | 75 | 15 | 10 | 10.5 | 11.8 | 10.6 | ⊙ |
| Example 8 | 90 | 5 | 5 | 11 | 11.2 | 12.3 | ○ |
| Example 9 | 92 | 5 | 3 | 11.2 | 11.3 | 12.5 | ○ |
| Example 10 | 70 | 20 | 10 | 12.2 | 12.9 | 12.4 | ○ |
| Example 4 | 85 | 10 | 5 | 9.8 | 11 | 10.4 | ⊙ |
| Example 11 | 75 | 15 | 10 | 10.4 | 11.4 | 10.5 | ⊙ |
| Example 12 | 90 | 5 | 5 | 10.8 | 11.4 | 12.7 | ○ |
| Example 5 | 85 | 10 | 5 | 10 | 11.2 | 10.5 | ⊙ |
| Example 13 | 75 | 15 | 10 | 10.3 | 11.8 | 10.9 | ⊙ |
| Example 14 | 90 | 5 | 5 | 10.7 | 11.3 | 12.8 | ○ |
| Example 6 | 85 | 10 | 5 | 11 | 12.3 | 11.4 | ○ |
| Example 15 | 75 | 15 | 10 | 11.4 | 12.8 | 12.1 | ○ |
| Example 16 | 90 | 5 | 5 | 11.4 | 11.9 | 12.9 | ○ |
| Comparative Example 7 | 95 | 3 | 2 | 12.5 | 12.6 | 14.7 | X |
| Comparative Example 8 | 65 | 20 | 15 | 13.8 | 16.7 | 13.9 | X |
| Comparative Example 9 | 85 | 2 | 13 | 10.7 | 16.7 | 12.3 | X |
| Comparative Example 10 | 95 | 3 | 2 | 12.3 | 12.5 | 13.8 | X |
| Comparative Example 11 | 65 | 20 | 15 | 13.2 | 15.5 | 13.9 | X |
| Comparative Example 12 | 85 | 2 | 13 | 10.5 | 15.9 | 12.1 | X |
| Comparative Example 13 | 95 | 3 | 2 | 12.6 | 12.8 | 14.9 | X |
| Comparative Example 14 | 65 | 20 | 15 | 13.7 | 15.1 | 14.0 | X |
| Comparative Example 15 | 95 | 3 | 2 | 12.8 | 13.0 | 15.9 | X |
| Comparative Example 16 | 65 | 20 | 15 | 13.9 | 15.8 | 14.3 | X |
| Comparative Example 17 | 85 | 10 | 5 | 11.6 | 14.8 | 13.3 | X |

TABLE 3-continued

| | | | | | | | |
|---|---|---|---|---|---|---|---|
| Comparative Example 18 | 85 | 10 | 5 | 11.3 | 14.7 | 13.9 | X |
| Comparative Example 19 | 85 | 10 | 5 | 13.9 | 19.8 | 18.8 | X |
| Comparative Example 20 | — | — | — | 15.8 | 21.9 | 16.9 | X |
| Comparative Example 21 | — | — | — | 17.9 | 20.3 | 19.8 | X |

The results of the evaluation described above show the following.

Using $Sb_xIn_yM_z$ (M is at least one element selected from Mo, Ge, Mn, and Al) as a phase-change recording material and setting the composition ratios of the respective elements in the ranges $0.70 \leq x \leq 0.92$, $0.05 \leq y \leq 0.20$, and $0.03 \leq z \leq 0.10$ make it possible to obtain good recording characteristics, maintain a good level of overwrite characteristics, and obtain high long-term storage stability, when high-density and high-linear-velocity recording is performed.

<iii Relationship Between Recording Characteristics and Component Ratios of First Dielectric Layer>

Examples 17 to 21

Optical disks were obtained similarly to Example 1, except that the component ratios of the first dielectric layer were changed as shown in Table 4.

(Evaluation)

The DOW 10 (6×) characteristics, the DOW 1,000 (6×) characteristics, and the Archival (6×) characteristics of the optical disks obtained as described above were evaluated as in Examples 1 to 6.

Table 4 shows the relationship between the material contents of the first dielectric layer and the recording characteristics.

TABLE 4

| | | | | i-MLSE | | | |
|---|---|---|---|---|---|---|---|
| | First dielectric layer | Phase-change recording layer | Second dielectric layer | DOW10 13% or less | DOW1000 13% or less | Archival 13% or less | Rating |
| Example 1 | $(ZrO_2)_{35}$—$(In_2O_3)_{30}$—$(SiO_2)_{35}$ | $Sb_{85}In_{10}Mo_5$ | $(ZrO_2)_{50}$—$(Cr_2O_3)_{30}$—$(SiO_2)_{20}$ | 10.1 | 11.3 | 10.9 | ⊙ |
| Example 17 | $(ZrO_2)_{15}$—$(In_2O_3)_{70}$—$(SiO_2)_{15}$ | | | 10.9 | 11.7 | 12.8 | ○ |
| Example 18 | $(ZrO_2)_{45}$—$(In_2O_3)_{10}$—$(SiO_2)_{45}$ | | | 10.3 | 11.3 | 11.6 | ⊙ |
| Example 19 | $(ZrO_2)_{70}$—$(In_2O_3)_{15}$—$(SiO_2)_{15}$ | | | 10.9 | 11.9 | 12.1 | ○ |
| Example 20 | $(ZrO_2)_{80}$—$(SiO_2)_{20}$ | | | 11.4 | 12.8 | 12.7 | ○ |
| Example 21 | $(ZrO_2)_{80}$—$(In_2O_3)_{20}$ | | | 11.3 | 12.5 | 12.9 | ○ |

The results of the evaluation described above show the following.

Particularly good overwrite and archival characteristics are obtained when the first dielectric layer has a zirconium oxide content of 20 mol % to 50 mol % and an indium oxide content of 10 mol % to 50 mol %.

<iv Relationship Between Recording Characteristics and Component Ratios of Second Dielectric Layer>

Examples 22 to 26

Optical disks were obtained similarly to Example 1, except that the component ratios of the second dielectric layer were changed as shown in Table 5.

(Evaluation)

The DOW 10 (6×) characteristics, the DOW 1,000 (6×) characteristics, and the Archival (6×) characteristics of the optical disks obtained as described above were evaluated as in Examples 1 to 6.

Table 5 shows the relationship between the component ratios of the second dielectric layer and the recording characteristics.

TABLE 5

| | | | | i-MLSE | | | |
|---|---|---|---|---|---|---|---|
| | First dielectric layer | Phase-change recording layer | Second dielectric layer | DOW10 13% or less | DOW1000 13% or less | Archival 13% or less | Rating |
| Example 1 | $(ZrO_2)_{35}$—$(In_2O_3)_{30}$—$(SiO_2)_{35}$ | $Sb_{85}In_{10}Mo_5$ | $(ZrO_2)_{50}$—$(Cr_2O_3)_{30}$—$(SiO_2)_{20}$ | 10.1 | 11.3 | 10.9 | ⊙ |
| Example 22 | | | $(ZrO_2)_{50}$—$(Cr_2O_3)_{10}$—$(SiO_2)_{40}$ | 10.7 | 12.8 | 11.1 | ○ |
| Example 23 | | | $(ZrO_2)_{25}$—$(Cr_2O_3)_{50}$—$(SiO_2)_{25}$ | 10.5 | 11.2 | 12.2 | ○ |

TABLE 5-continued

| | First dielectric layer | Phase-change recording layer | Second dielectric layer | i-MLSE DOW10 13% or less | i-MLSE DOW1000 13% or less | i-MLSE Archival 13% or less | Rating |
|---|---|---|---|---|---|---|---|
| Example 24 | | | $(ZrO_2)_{15}$—$(Cr_2O_3)_{70}$—$(SiO_2)_{15}$ | 10.9 | 11 | 12.8 | ○ |
| Example 25 | | | $(ZrO_2)_{20}$—$(Cr_2O_3)_{80}$ | 11.1 | 11.8 | 12.8 | ○ |
| Example 26 | | | $(Cr_2O_3)_{80}$—$(SiO_2)_{20}$ | 11.0 | 11.7 | 12.9 | ○ |

The results of the evaluation described above show the following.

Particularly good overwrite and archival characteristics are obtained when the second dielectric layer has a zirconium oxide content of 30 mol % to 70 mol % and a chromium oxide content of 20 mol % to 50 mol %.

<v Relationship Between Recording Characteristics and Thickness of Phase-Change Recording Layer>

Examples 27 to 30

Optical disks were obtained similarly to Example 1, except that the thickness of the phase-change recording layer was changed as shown in Table 6.

(Measurement of Transmittance)

The transmittance of the optical disks obtained as described above was measured at a recording wavelength of 405 nm using a spectrophotometer (V530 (trade name) manufactured by JASCO Corporation). The measurement results are shown in Table 4.

(Evaluation)

The DOW 10 (6×) characteristics, the DOW 1,000 (6×) characteristics, and the Archival (6×) characteristics of the optical disks obtained as described above were measured as in Examples 1 to 6. The results of these three measurements and the results of the measurement of the transmittance were evaluated according to the following criteria.

⊙: The resulting i-MLSE value is 12.0% or less in all the three measurements, and the resulting transmittance is 50% or more.

○: The resulting i-MLSE value is 12.0% or less in all the three measurements, but the resulting transmittance is less than 50%, or the resulting i-MLSE value is 13.0% or less in all the three measurements and more than 12.0% to 13.0% in at least one of the three measurements.

x: The resulting i-MLSE value is more than 13.0% in at least one of the three measurements.

Table 6 shows the relationship between the thickness of the phase-change recording layer and the recording characteristics.

The results of the evaluation described above show the following.

The transmittance can be increased to 50% or more by reducing the thickness of the phase-change recording layer to 8 nm or less. In a case where the L0 layer for the three-layer optical disk has a reflectivity of 25% when existing as a single layer and if the L1 and L2 layers each have a transmittance of 50% when each existing as a single layer, the three-layer optical disk can have a L0 layer reflectivity of at least 1.5% (25%×$0.5^2$×$0.5^2$) on the light-receiving surface side. If the reflectivity is at least 1.5% as described above, the beam can be returned in an amount enough to obtain good reproduction characteristics with current consumer drives. In this regard, the reflectivity of the L0 layer can be increased to more than 25% by changing the composition of the film or other conditions. However, there is a tradeoff between the reflectivity and the modulated amplitude at which good reproduction characteristics can be ensured, which can make it difficult to obtain a reflectivity of more than 25%.

<vi Relationship Between Recording Characteristics of Respective Layers (Three-Layer Disk)>

Example 31

First, a 1.1-mm-thick polycarbonate substrate was formed by injection molding. Note that a concave-convex surface with grooves and lands was formed on the polycarbonate substrate. Subsequently, an L0 layer having the configuration (material and thickness) shown below was formed by sputtering on the concave-convex surface of the polycarbonate substrate.

Reflective layer: Ag alloy (AgPdCu), 80 nm

First dielectric layer: $(SiO_2)_{35}$—$(In_2O_3)_{30}$—$(ZrO_2)_{35}$, 14 nm

Phase-change recording layer: $Sb_{80}$—$In_{10}$—$Mo_{10}$, 10 nm

Second dielectric layer: $(SiO_2)_{20}$—$(Cr_2O_3)_{30}$—$(ZrO_2)_{50}$, 18 nm

Protective layer: SiN, 60 nm

TABLE 6

| | Phase-change recording layer Material | Phase-change recording layer Thickness [nm] | i-MLSE DOW10 13% or less | i-MLSE DOW1000 13% or less | i-MLSE Archival 13% or less | Transmittance [%] | Rating |
|---|---|---|---|---|---|---|---|
| Example 1 | $Sb_{85}In_{10}Mo_5$ | 7 | 10.1 | 11.3 | 10.9 | 51.78 | ⊙ |
| Example 27 | | 10 | 9.8 | 10.8 | 10.6 | 45.27 | ○ |
| Example 28 | | 12 | 9.6 | 10.4 | 10.4 | 41.46 | ○ |
| Example 29 | | 6 | 10.4 | 12.4 | 12.6 | 54.19 | ○ |
| Example 30 | | 5 | 11.5 | 12.8 | 12.9 | 56.72 | ○ |

Subsequently, an ultraviolet-curable resin was uniformly applied to the L0 layer by spin coating. The concave-convex pattern of a stamper was then pressed against the ultraviolet-curable resin, which had been uniformly applied to the layer L0. The ultraviolet-curable resin was cured by being irradiated with ultraviolet rays, and then the stamper was removed. A 25-μm-thick space layer having a concave-convex surface with lands and grooves was formed by these processes.

Subsequently, an L1 layer having the configuration (material and thickness) shown below was formed by sputtering on the concave-convex surface of the space layer.

Transmittance enhancing layer: $TiO_2$, 11 nm
Semi-transparent reflective layer: Ag alloy (AgPdCu), 9.5 nm
First dielectric layer: $(SiO_2)_{35}$—$(In_2O_3)_{30}$—$(ZrO_2)_{35}$, 6 nm
Phase-change recording layer: $Sb_{80}$—$In_{10}$—$Mo_{10}$, 7 nm
Second dielectric layer: $(SiO_2)_{20}$—$(Cr_2O_3)_{30}$—$(ZrO_2)_{50}$, 22 nm
Protective layer: SiN, 30 nm being irradiated with ultraviolet rays to form a 57-μm-thick optically transparent layer.

As a result, the desired three-layer optical disk was obtained.

Example 32

A three-layer optical disk was obtained similarly to Example 31, except that the material used to form the phase-change recording layer for the L0, L1, and L2 layers was changed to $Sb_{80}$—$In_{10}$—$Ge_{10}$.

(Evaluation)

The DOW 10 (6×) characteristics, the DOW 1,000 (6×) characteristics, and the Archival (6×) characteristics of the optical disks obtained as described above were evaluated as in Examples 1 to 6.

Tables 7A and 7B show the relationship between the recording characteristics of the respective layers (three-layer disk).

TABLE 7A

|  | First dielectric layer | Phase-change recording layer | Second dielectric layer | Phase-change recording layer Component ratios [at %] | | |
|---|---|---|---|---|---|---|
|  |  |  |  | x 70-92 | y 5-20 | z 3-10 |
| Example 31 | $(ZrO_2)_{35}$—$(In_2O_3)_{30}$—$(SiO_2)_{35}$ | SbInMo | $(ZrO_2)_{50}$—$(Cr_2O_3)_{30}$—$(SiO_2)_{20}$ | 80 | 10 | 10 |
| Example 32 | $(ZrO_2)_{35}$—$(In_2O_3)_{30}$—$(SiO_2)_{35}$ | SbInGe | $(ZrO_2)_{50}$—$(Cr_2O_3)_{30}$—$(SiO_2)_{20}$ | 80 | 10 | 10 |

TABLE 7B

|  | i-MLSE(L0) | | | | i-MLSE(L1) | | | | i-MLSE(L2) | | | |
|---|---|---|---|---|---|---|---|---|---|---|---|---|
|  | DOW10 13% or less | DOW1000 13% or less | Archival 13% or less | Rating | DOW10 13% or less | DOW1000 13% or less | Archival 13% or less | Rating | DOW10 13% or less | DOW1000 13% or less | Archival 13% or less | Rating |
| Example 31 | 9.9 | 11.0 | 10.8 | ⊙ | 10.6 | 12.8 | 12.9 | ○ | 10.4 | 12.4 | 12.6 | ○ |
| Example 32 | 9.5 | 10.5 | 10.4 | ⊙ | 10.4 | 12.0 | 11.5 | ⊙ | 10.2 | 11.8 | 10.8 | ⊙ |

Subsequently, an ultraviolet-curable resin was uniformly applied to the recording layer L1 by spin coating. The concave-convex pattern of a stamper was then pressed against the ultraviolet-curable resin, which had been uniformly applied to the layer L0. The ultraviolet-curable resin was cured by being irradiated with ultraviolet rays, and then the stamper was removed. An 18-μm-thick space layer having a concave-convex surface with lands and grooves was formed by these processes.

Subsequently, an L2 layer having the configuration (material and thickness) shown below was formed by sputtering on the concave-convex surface of the space layer.

Transmittance enhancing layer: $TiO_2$, 12 nm
Semi-transparent reflective layer: Ag alloy (AgPdCu), 9.5 nm
First dielectric layer: $(SiO_2)_{35}$—$(In_2O_3)_{30}$—$(ZrO_2)_{35}$, 6 nm
Phase-change recording layer: $Sb_{80}$—$In_{10}$—$Mo_{10}$, 7 nm
Second dielectric layer: $(SiO_2)_{20}$—$(Cr_2O_3)_{30}$—$(ZrO_2)_{50}$, 24 nm
Protective layer: SiN, 18 nm Subsequently, an ultraviolet-curable resin was uniformly applied to the L2 layer by spin coating, and then cured by The results of the evaluation described above show the following.

All the three recording layers make it possible to obtain good recording characteristics, maintain a good level of overwrite characteristics, and obtain high long-term storage stability, when high-density and high-linear-velocity recording is performed.

Although, embodiments of the present technology and modifications thereof, and examples of the present technology have been described specifically, the embodiments, the modifications, and the examples described above are not intended to limit the present technology and they may be altered or modified in various manners based on the technical idea of the present technology.

For example, the configurations, methods, processes, shapes, materials, values, and other conditions shown in the embodiments, the modifications thereof, and the examples are only by way of example, and if necessary, configurations, methods, processes, shapes, materials, values, and other conditions different from the above may also be used.

In addition, the configurations, methods, processes, shapes, materials, values, and other conditions shown in the embodiments, the modifications thereof, and the examples may also be combined without departing from the gist of the present technology.

In addition, although the above embodiments and modifications thereof have shown examples where the optical recording medium has a plurality of recording layers, such examples are not intended to limit the present technology and the present technology is also applicable to optical recording media having a single recording layer.

In addition, although the above embodiments and modifications thereof have shown examples where the present technology is applied to an optical recording medium that includes a substrate and a plurality of recording layers and an optically transparent layer stacked in this order on the substrate and allows information signals to be recorded on or reproduced from the plurality of recording layers when a laser beam is applied to the recording layers from the optically transparent layer side, such examples are not intended to limit the present technology. For example, the present technology is also applicable to an optical recording medium that includes a substrate and a plurality of recording layers and a cover layer stacked in this order on the substrate and allows information signals to be recorded on or reproduced from the plurality of recording layers when a laser beam is applied to the recording layers from the substrate side, or the present technology is also applicable to an optical recording medium that includes two substrate and a plurality of recording layers provided between the substrates and allows information signals to be recorded on or reproduced from the plurality of recording layers when a laser beam is applied to the recording layers from at least one of the two substrate sides.

The present technology may also have the following configurations.

(1) An optical recording medium including a reflective layer, a first dielectric layer, a phase-change recording layer, and a second dielectric layer, in which the phase-change recording layer has an average composition represented by formula (1): $Sb_xIn_yM_z$, in which M is at least one of Mo, Ge, Mn, and Al, and x, y, and z are values in the ranges $0.70 \le x \le 0.92$, $0.05 \le y \le 0.20$, and $0.03 \le z \le 0.10$, respectively, provided that $x+y+z=1$, the first dielectric layer includes a zirconium oxide-containing composite material or tantalum oxide, and the second dielectric layer includes a chromium oxide-containing composite material or silicon nitride.

(2) The optical recording medium according to item (1), in which the first dielectric layer includes a composite oxide including zirconium oxide and at least one of indium oxide and silicon oxide.

(3) The optical recording medium according to item (1), in which the first dielectric layer includes a composite oxide including zirconium oxide and indium oxide and has a zirconium oxide content of 20 mol % to 50 mol % and an indium oxide content of 10 mol % to 50 mol %.

(4) The optical recording medium according to item (1), in which the second dielectric layer includes a composite oxide including at least two of chromium oxide, zirconium oxide, and silicon oxide.

(5) The optical recording medium according to item (1), in which the second dielectric layer includes a composite oxide including chromium oxide and zirconium oxide and has a chromium oxide content of 20 mol % to 50 mol % and a zirconium oxide content of 30 mol % to 70 mol %.

(6) The optical recording medium according to any one of items (1) to (5), in which the phase-change recording layer has a thickness of 8 nm or less.

(7) The optical recording medium according to any one of items (1) to (6), which has a highest recording linear velocity of 14 m/s to 23 m/s and a shortest recording mark length of 112 nm or less.

(8) An optical recording medium including two or more recording layers each including a reflective layer, a first dielectric layer, a phase-change recording layer, and a second dielectric layer, in which the phase-change recording layer has an average composition represented by formula (1): $Sb_xIn_yM_z$, in which M is at least one of Mo, Ge, Mn, and Al, and x, y, and z are values in the ranges $0.70 \le x \le 0.92$, $0.05 \le y \le 0.20$, and $0.03 \le z \le 0.10$, respectively, provided that $x+y+z=1$, the sum of x and y in the recording layer located shallower than the recording layer most distant from a light-receiving side is larger than the sum of x and y in the most distant recording layer, the first dielectric layer includes a zirconium oxide-containing composite material or tantalum oxide, and the second dielectric layer includes a chromium oxide-containing composite material or silicon nitride.

REFERENCE SIGNS LIST 10, 40 Optical recording medium
11 Substrate
21 Reflective layer
22, 33 First dielectric layer
23, 34 Phase-change recording layer
24, 35 Second dielectric layer
25, 36 Protective layer
31 Transmittance enhancing layer
32 Semi-transparent reflective layer
40a First optical disk
40b Second optical disk
L1 to Ln Recording layer
S1 to Sn Space layer
C, C1, C2 Light-receiving surface
Ld Land
Gv Groove

The invention claimed is:

1. An optical recording medium, comprising:
    a reflective layer;
    a first dielectric layer;
    a phase-change recording layer; and
    a second dielectric layer,
        wherein the phase-change recording layer has an average composition represented by formula (1): $Sb_xIn_yM_z$,
        wherein M is at least one of Mo, Mn, or Al, and x, y, and z are values in ranges $0.70 \le x \le 0.92$, $0.05 \le y \le 0.20$, and $0.03 \le z \le 0.10$, respectively, provided that $x+y+z=1$,
        wherein the first dielectric layer comprises one of a zirconium oxide-containing composite material or tantalum oxide, and
        wherein the second dielectric layer comprises one of a chromium oxide-containing composite material or silicon nitride.

2. The optical recording medium according to claim 1, wherein the first dielectric layer comprises a composite oxide comprising zirconium oxide and at least one of indium oxide or silicon oxide.

3. The optical recording medium according to claim 1, wherein the first dielectric layer comprises a composite oxide comprising zirconium oxide and indium oxide, and wherein the composite oxide has zirconium oxide content of 20 mol % to 50 mol % and indium oxide content of 10 mol % to 50 mol %.

4. The optical recording medium according to claim 1, wherein the second dielectric layer comprises a composite oxide comprising at least two of chromium oxide, zirconium oxide, or silicon oxide.

5. The optical recording medium according to claim 1, wherein the second dielectric layer comprises a composite oxide comprising chromium oxide and zirconium oxide, and wherein the composite oxide has chromium oxide content of 20 mol % to 50 mol % and zirconium oxide content of 30 mol % to 70 mol %.

6. The optical recording medium according to claim 1, wherein a thickness of the phase-change recording layer is one of less than or equal to 8 nm.

7. The optical recording medium according to claim 1, wherein the optical recording medium has a recording linear velocity from 14 m/s to 23 m/s and a recording mark length one of less than or equal to 112 nm.

8. An optical recording medium, comprising:
at least two recording layers, each recording layer of the at least two recording layers comprising
a reflective layer,
a first dielectric layer,
a phase-change recording layer, and
a second dielectric layer,
wherein the phase-change recording layer has an average composition represented by formula (1): $Sb_xIn_yM_z$,
wherein M is at least one of Mo, Mn, or Al, and x, y, and z are values in ranges $0.70 \leq x \leq 0.92$, $0.05 \leq y \leq 0.20$, and $0.03 \leq z \leq 0.10$, respectively, provided that $x+y+z=1$,
wherein a first recording layer of the at least two recording layers is located deeper in the optical recording medium than a second recording layer of the at least two recording layers,
wherein a sum of x and y in the first recording layer is smaller than the sum of x and y in second recording layer,
wherein the first dielectric layer comprises one of a zirconium oxide-containing composite material or tantalum oxide, and
wherein the second dielectric layer comprises one of a chromium oxide-containing composite material or silicon nitride.

\* \* \* \* \*